United States Patent [19]

Friedman et al.

[11] Patent Number: 5,132,638
[45] Date of Patent: Jul. 21, 1992

[54] HIGH POWER KLYSTRON AMPLIFIER

[75] Inventors: Moshe Friedman, Washington, D.C.;
Yue-Ying Lau, Potomac, Md.;
Jonathan F. Krall, Washington, D.C.;
Victor Serlin, Springfield, Va.

[73] Assignee: The United States of America as represented by the Secretary of the Navy, Washington, D.C.

[21] Appl. No.: 641,997

[22] Filed: Jan. 16, 1991

[51] Int. Cl.[5] .............................................. H03F 3/56
[52] U.S. Cl. ...................................... 330/45; 315/5.31
[58] Field of Search .................. 330/43, 44, 45; 315/5, 315/5.31; 331/83

[56] References Cited

U.S. PATENT DOCUMENTS

| | | | |
|---|---|---|---|
| 2,466,064 | 4/1949 | Wathen et al. | 315/5.31 |
| 4,523,127 | 6/1985 | Moeller | 315/5.31 X |
| 4,604,551 | 8/1986 | Moeller | 315/5.31 X |
| 4,757,269 | 7/1988 | Friedman et al. | 330/47 |
| 4,780,647 | 10/1988 | Friedman et al. | 315/5.41 |
| 4,897,609 | 1/1990 | Mallavarpu | 330/43 |

OTHER PUBLICATIONS

M. Friedman et al., "The Influence of Beam Loading on the Operation of the Relativistic Klystron Amplifier," SPIE vol. 1226, Intense Microwave and Particle Beams, p. 2 (1990).
Relativistic Klystron Amplifiers Driven by Modulated Intense Relativistic Electron Beams, Y. Y. Lau et al., NRL Memorandum Report 6627.
Efficient generation of multigigawatt rf power by a klystronlike amplifier, M. Friedman et al., Rev. Sci. Instrum. 61 (1), Jan. 1990.

Primary Examiner—James B. Mullins
Attorney, Agent, or Firm—Thomas E. McDonnell; Edward F. Miles

[57] ABSTRACT

A klystron amplifier in which the drift tube is in the form of a casing and a central member disposed coaxially about the same centerline to form a coaxial space between the central member and the casing which runs parallel to the centerline, and through which the klystron's electron beam flows. The casing and central member are maintained at ground potential, which maintains the space charge of the electron beam at a low level, permitting the klystron to operate more efficiently and output higher power.

7 Claims, 2 Drawing Sheets

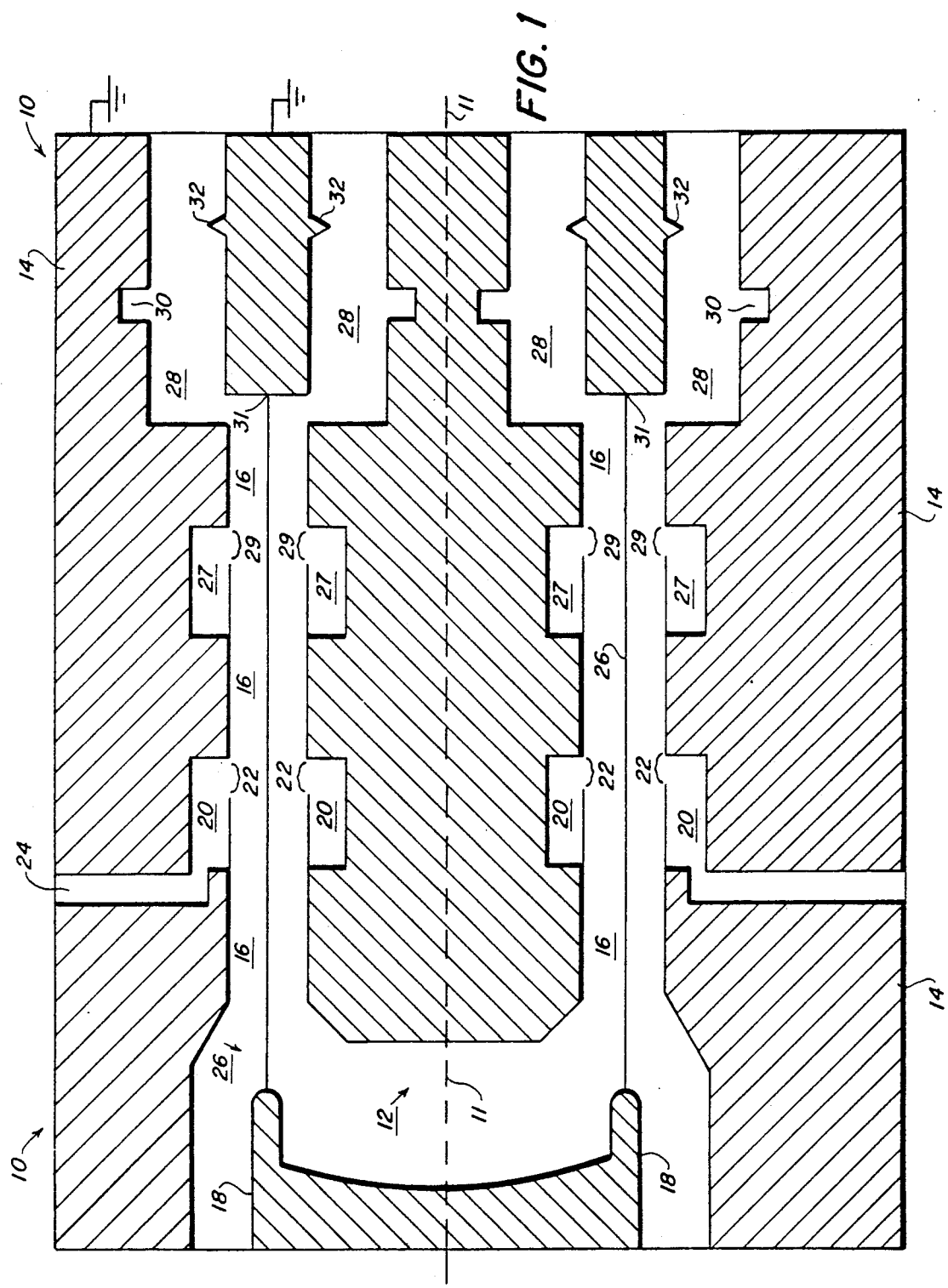

HIGH POWER KLYSTRON AMPLIFIER

BACKGROUND OF THE INVENTION

Modern klystron amplifiers typically have used pencil-thin electron beams, and pill-box shaped resonant cavities to bunch the and extract electromagnetic radiation from the beams. However, because in such a configuration the electron beam is confined to such a small volume, the space charge effects and beam loading limit the total charge and total energy such a beam can carry, and hence limit the klystron's power output. To overcome this, klystrons have been developed at the Naval Research Laboratory which have a hollow beam in a hollow drift tube. This configuration reduces space charge depression, and, because the beam in this configuration is generally cylindrical, rather than pencil-like, such a configuration can carry higher total current for the same current density. The hollow drift tube configuration is limited in that the frequency of operation must be below the cutoff frequency of the drift tube. This limits the radius of the drift tube. Because the radius is limited, the amount of current is limited by space charge effects. It appears that such configurations are limited to power of about 30 GW. It is believed that one reason for this apparent limit is that prior high power klystron tubes have a large electric potential between the electron beam and the walls.

SUMMARY OF THE INVENTION

Accordingly, an object of the invention is to increase the upper limit of klystron power output.

Another object is to reduce the space charge and beam loading in the drift tube of such a klystron.

Another object is to do this by maintaining the parts of the klystron's nested coaxial drift tube which surround the klystron's electron beam at ground potential.

In accordance with these and other objects made apparent hereinafter, the invention in its broadest form is a klystron amplifier having a drift tube and an electron emission device for injecting an electron beam into the drift tube. The drift tube has a casing and a central member disposed coaxially about the same centerline to form a space therebetween running substantially parallel to the centerline. The electron emission device injects the electron beam into this space coaxially about the centerline. The drift tube has a RF cavity which permits introduction of a radio-frequency signal into the space.

Because the coaxial geometry does not support TM electromagnetic modes, the restriction on radius normally dictated by frequency of operation for a hollow drift tube is removed. The devices can thus be larger, and carry more power without increasing the space charge potential of the beam.

In a particular embodiment, the casing and the central member are maintained at ground potential to further reduce the space charge potential of the beam.

By having the casing and central member, the coaxial members through which the electron beam flows, at ground potential, the space charge of the electron beam can be maintained at a low value.

Reducing this space charge permits increased klystron power in three ways: First, less kinetic energy need be removed from the beam electrons as they traverse the drift tube. Second, reduced space charge reduces beam loading at the high voltage gaps, thereby reducing the influence of the beam on the modulating cavity. Third, reduced space charge and having a small spacing between the coaxial members reduces the fringing electric field around the resonant cavity gaps. These resonant cavities are used to modulate the electron beam and extract power from the klystron at the desired output frequency. The larger the transverse spacing between the coaxial tubes and the higher the space charge field in the vicinity of such gaps, the larger the effective gap length will be due to fringe electric fields. This increases the effective length of the gap, reducing the coupling of the cavities to the electron beam, thus reducing power output. For the coaxial klystron, which insures a reduced electric potential in the space through which the beam flows, the effective gap length can approach physical gap length, making for an especially efficient klystron.

Other objects, features, and advantages of the invention will be apparent from the following detailed description of preferred embodiments, when read in conjunction with the accompanying drawings, wherein:

BRIEF DESCRIPTION OF THE DRAWINGS

FIG. 1 is a cross sectional plan view of a device according to the invention. The cross sectional cut is by a plane passing through the centerline of the device, and the view is perpendicular to that plane.

DETAILED DESCRIPTION

Figure 2A:
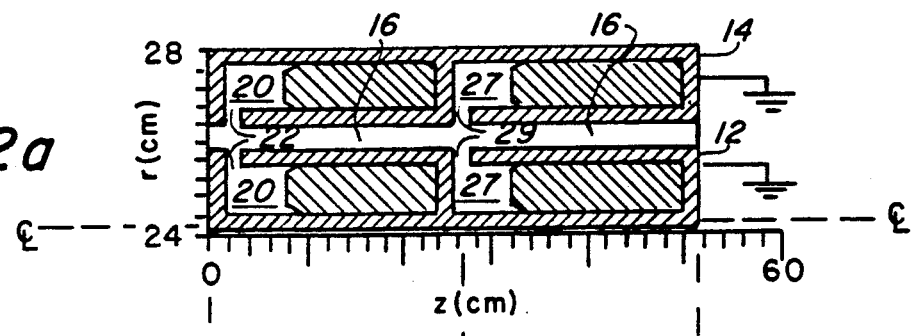
FIG. 2a is a view like that of FIG. 1, of a device like that of FIG. 1, which illustrates the geometry used in a numerical simulation to evaluate the performance of the invention.

With reference to the drawing figures, in which like numbers indicate like parts throughout the several views, FIG. 1 shows a device 10 in accordance with the invention. Klystron 10 is annularly symmetric about centerline 11, and has a central member 12 and a casing 14 nested coaxially within one another, and defining a space 16 between them. Casing 14 and central member 12 are both at ground potential. A member 18 can inject electrons into space 16 to form a cylindrical electron beam 26 which traverses space 16 parallel to centerline 11 until beam 26 terminates on annular ridge 31. Member 18 is a diode which is capable of ejecting electrons at relativistic kinetic energies. A magnetic field (not shown) is applied across klystron 10 parallel to centerline 11, to inhibit beam 26 from diverging. Casing 14 and central member 12 have cooperating annular indentations which together form resonant cavities 20 and 27, with respective conventional gaps 22 and 29. The dimensions of cavities 20, 27, and gaps 22, 29, are chosen so that the resonant frequency of the cavities is the desired output of klystron 10. Waveguiding passage 24 penetrates casing 14 and opens into cavity 20 to permit an external RF signal to modulate (bunch) beam 26 through cavity 20, in accordance with known klystron principles. In principle, one cavity could be sufficient to modulate the klystron's output sufficiently; however, experience suggests that one or more additional passive (undriven) cavities such as 27 can increase the degree of modulation significantly. Electromagnetic radiation resulting from the bunched electrons propagates to output portion 28 of klystron 10 where it is available for use. Output portion 28 can have slots or stubs, such as 30 and 32, to match the output to klystron 10's load.

In operation, annular diode 18 ejects electrons at relativistic energies in the form of a relatively thin cylindrical beam 26. As beam 26 traverses space 16, the RF signal in 20, 24 modulates beam 26, and resonant cavity 27 further modulates beam 26. Output cavity 28 extracts electromagnetic power from beam 26. Because central member 12 and outer casing 14 are at ground potential, the space charge in space 16 is less, and beam 26 has more kinetic energy traversing space 16. This energy is available as additional output. Also, because the space charge potential of beam 26 is reduced, the fringe fields around gaps 22, 29 are reduced and the coupling between gaps 22, 29 and the beam 26 in increased. Additionally, because the space charge is less, there is less beam loading, that is less influence of the beam 26 on the resonance frequency of cavities 20 and 27. The resonance frequency of cavities 20 and 27 closely match the frequency of the RF signal input at 24, which optimizes power transfer through klystron 10.

In order to further illustrate the effectiveness of klystron 10, the following calculations are presented:

For a conventional klystron drift tube with cylindrical geometry, the total current is limited to I less than a limiting current $I_c$, where:

$$I_c = I_s(\gamma^{\frac{2}{3}} - 1)$$

where $I_s$ is the current scale, a scaling factor depending on the particular geometry of the drift tube, $\gamma = (1 - \beta_0^2)^{-\frac{1}{2}}$, $\beta = v_0/c$, $v_0$ is the streaming velocity of electrons in the tube (i.e. somewhat reduced relative to the velocity at which electrons are emitted by diode 18, by the space charge potential of beam 26), and c is the speed of light. For the geometry of klystron 10, one can show that:

$$I_s = (17kA/2)[1/ln(r_b/r_{wi}) + 1/ln(r_{w0}/r_b)]$$

where $r_b$ is the radius of beam 26, $r_{wi}$ is the inner radius of space 16, and $r_{w0}$ is the outer radius of space 16. (Please see FIG. 1.)

This current scale $I_s$ is greater, for instance, than that of previous non-coaxial klystrons. For an electron beam propagating in a hollow drift tube, $I_s = (17kA/2)/ln(r_w/r_b)$, which is less than the above expression for $I_s$, given above.

As a result of the beam-gap interaction at gap 22, the current modulation $I_1$ is:

$$I_1 = (V_{gap}/Z)\text{Sin}(kz)$$

where:
 $V_{gap}$ is the electric potential at gap 22.
 $Z^{gap} = (30\Omega/\beta_0)/ln(r_{w0}/r_b)$, which is the impedance at gap 22, for this geometry.
 z is the distance downstream from gap 22, measured in centimeters.
 $k \approx \alpha\mu\omega/v_0$.
 $\omega$ is the angular frequency of the RF signal input at 24.
 $\alpha = (I_0/I_s)/(\gamma_0^3\beta_0)$.
 $I_0$ is the magnitude of the DC current in beam 26.
 $\mu^0 = \alpha^{\frac{1}{2}}/(\beta_0\gamma_0)$. Note that the total current in beam 26 varies as Note that the total current in beam 26 varies as $$I(t) = I_0 + I_1\sin(wt)$$

In any klystron, I must be less than or equal to $I_c$ at all times.

If one assumes typical values for klystron 10's dimensions, such as:
 $\omega = (1.3 \text{ GHz})/(2\pi)$.
 $I_0 = 100$ kA of 500 keV electrons.
 $r_{w0} = 26.4$ cm.
 $r_{wi} = 25.8$ cm.
 $r_b = 26.1$ cm.
 $I_c = 650$ kA.
 $V_{gap} = 28$ kV.
One gets:
 $\alpha = 1.1$
 $\beta_0 = 0.85$
 $\gamma_0 1.9$
 $\mu = 5.8$
 $k = 0.022$ cm$^{-1}$
 $Z = 1.7\Omega$ Using the above expression for the modulation $I^1$:

$$I_1 \approx (16kA)\text{Sin}(0.022\text{cm}^{-1}z)$$

This relatively low level of modulation from gap 22 is in close agreement with the simulation result of FIG. 2. Compare, for example, the above expression with the modulation from the first gap, located at z=2.4 cm.

Figure 2B:
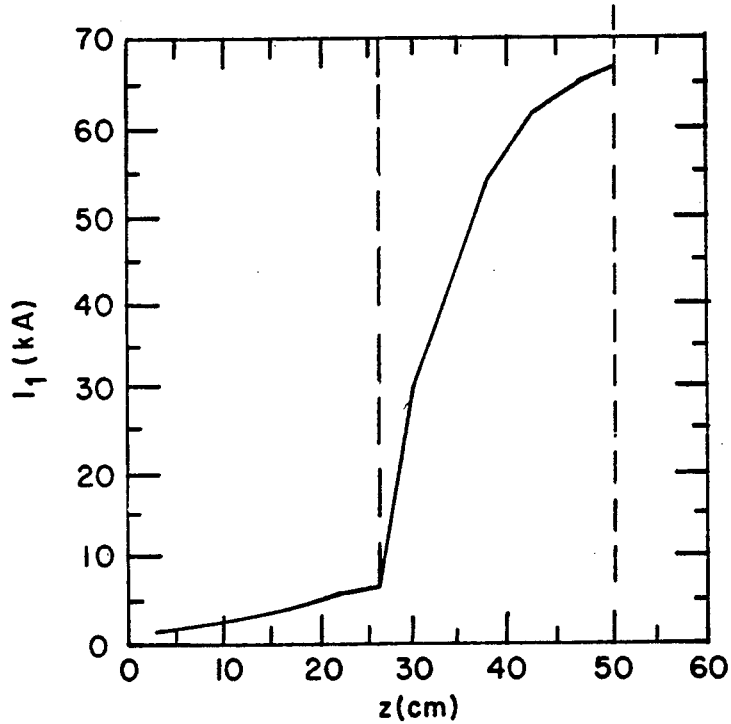
FIG. 2b is a graph showing the results of the numerical simulation.

FIG. 2a shows a klystron like that of FIG. 1, with particular dimensions given. (Please note that FIG. 2 shows only the upper portion of the klystron, i.e. the portion with the cavity and the beam to one side of the klystron's centerline, which is located at r=0 below the z axis in FIG. 2a.) FIG. 2b shows the results of a computer simulation of the modulation ($I_1$) which the device of FIG. 2a would produce on a 100 kA beam 26 of 500 keV electrons. FIG. 2a shows a modest increase in modulation between cavities 20 and 27, in agreement with the expression for $I_1$, above, followed by a sharp rise downstream of cavity 27.

The invention has been described in what is considered to be the most practical and preferred embodiments. However, the invention is capable of extended application beyond the precise details of these embodiments. Changes and modifications will occur to those skilled in the art that may differ from the preferred embodiments, but that are still within the spirit and scope of the invention as expressed in the appended claims. Accordingly, the invention is to be discerned by reference to the claims, wherein:

We claim:
1. A klystron amplifier comprising:
 a drift tube; and
 an emission means for injecting an electron beam into said drift tube;
 wherein said drift tube comprises a casing and a central member, said casing and said central member being disposed coaxially about the same centerline to form a space between said central member and said casing running substantially parallel to said centerline; and
 means for introducing an electromagnetic modulation signal into said space;
 wherein said emission means is effective to inject said electron beam into said space cylindrically about said centerline;
 said amplifier further comprises means for maintaining said casing and said central member at ground potential; and wherein said casing and said central member are shaped to cooperate to form a resonant cavity open to said space, said casing has a waveguiding means for transmitting said electromagnetic modulation signal to said resonant cavity and said waveguiding means are said means for introducing said electromagnet modulation signal into said space.

2. The amplifier of claim 1, wherein said casing, said central member, and said space are annularly symmetric about said centerline.

3. The amplifier of claim 2, wherein said electron beam is an intense relativistic electron beam.

4. The amplifier of claim 1, wherein said electron beam is an intense relativistic electron beam.

5. A klystron amplifier comprising:
a drift tube; and
an emission means for injecting an electron beam into said drift tube;
wherein said drift tube comprises a casing and a central member, said casing and said central member being disposed coaxially about the same centerline to form a space between said central member and said casing running substantially parallel to said centerline; and
means for introducing an electromagnetic modulation signal into said space; and
wherein said emission means is effective to inject said electron beam into said space cylindrically about said centerline; and
wherein said casing and said central member are shaped to cooperate to form a resonsant cavity open to said space, said casing has a waveguiding means for transmitting said electromagnetic modulation signal to said resonant cavity and said waveguiding means are said means for introducing said electromagnetic modulation signal into said space.

6. A klystron amplifier comprising:
a drift tube; and
an emission means for injecting an electron beam into said drift tube;
wherein said drift tube comprises a casing and a central member, said casing and said central member being disposed coaxially about the same centerline to form a space between said central member and said casing running substantially parallel to said centerline; and
means for introducing an electromagnetic modulation signal into said space;
wherein said emission means is effective to inject said electron beam into said space cylindrically about said centerline; and
wherein said klystron amplifier is adapted to cause the output of said klystron amplifier to be predominantly the result of bunching of electrons in said electron beam.

7. A klystron amplifier comprising:
a drift tube; and
an emission means for injecting an electron beam into said drift tube;
wherein said drift tube comprises a casing and a central member, said casing and said central member being disposed coaxially about the same centerline to form a space between said central member and said casing running substantially parallel to said centerline; and
means for introducing an electromagnetic modulation signal into said space;
wherein said emission means is effective to inject said electron beam into said space cylindrically about said centerline; and
wherein the output of said klystron amplifier is adapted to cause substantially all of the electrons in said electron beam to traverse a linear path substantially parallel to said centerline.

* * * * *